(12) United States Patent
Basceri et al.

(10) Patent No.: US 6,444,478 B1
(45) Date of Patent: Sep. 3, 2002

(54) DIELECTRIC FILMS AND METHODS OF FORMING SAME

(75) Inventors: Cem Basceri, Boise; Dan Gealy, Kuna, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/385,581

(22) Filed: Aug. 31, 1999

(51) Int. Cl.[7] ............................................. H01L 21/00
(52) U.S. Cl. ........................... 438/3; 438/240; 438/253; 438/396
(58) Field of Search ........................... 438/3, 240, 253, 438/396

(56) References Cited

U.S. PATENT DOCUMENTS

| | | |
|---|---|---|
| 5,254,505 A | 10/1993 | Kamiyama |
| 5,256,455 A | 10/1993 | Numasawa |
| 5,270,241 A | 12/1993 | Dennison et al. |
| 5,392,189 A | 2/1995 | Fazan et al. |
| 5,459,635 A | 10/1995 | Tomozawa et al. |
| 5,470,398 A | 11/1995 | Shibuya et al. |
| 5,596,214 A | 1/1997 | Endo |
| 5,614,018 A | 3/1997 | Azuma et al. |
| 5,618,761 A | 4/1997 | Eguchi et al. |

(List continued on next page.)

FOREIGN PATENT DOCUMENTS

| | | |
|---|---|---|
| EP | 0 474 140 B1 | 3/1992 |
| EP | 0 474 140 A1 | 3/1992 |
| EP | 0 810 666 A1 | 12/1997 |
| EP | 0 855 735 A3 | 7/1998 |
| EP | 0 855 735 A2 | 7/1998 |
| EP | 0 892 426 A2 | 1/1999 |
| EP | 0 957 522 A2 | 5/1999 |
| WO | WO 98/39497 | 9/1998 |

OTHER PUBLICATIONS

Basceri, Cem. "Electrical and Dielectric Properties of (Ba, Sr)TiO3 Thin Film Capacitors for Ultra–High Density Dynamic Random Access Memories" 1997, North Carolina State University dissertation pp. 1–171.*

Basceri et al., "The Dielectric Repsonse as a Funcion of Temperature and Film Thickness of FIber–Textured (Ba, Sr)TiO3 Thin Films Grown by Chemical Vapor Deposition", Journal of Applied Physics 82(5), Sep. 1997, pp. 2497–2503).*

Paek et al., Abstract, "Characterisation of MIS capacitor of BST thin films deposited on Si by RF magnetron sputtering", *Ferroelectric Thin Films V Symposium*, Apr. 7–12, 1996 San Francisco, CA, pp. 33–38 (1995).

Takeuchi et al., Abstract, "Effect of firing atmosphere on the cubic–hexagonal transition in $Ba_{0.99}Sr_{0.01}TiO_3$", *Nippon Seramikkusu Kyokai Gakujutsu Ronbunshi*, 98(8):836–839 (1990).

Yamaguchi et al., Abstract, "Reactive coevaporation synthesis and characterization of $SrTiO_3$–$BaTiO_3$ thin films", *Proceedings of the IEEE International Symposium on Applications of Ferroelectrics*, Aug. 30–Sep. 2, 1992, Greenville, S.C., pp. 285–288 (1992).

(List continued on next page.)

Primary Examiner—John F. Niebling
Assistant Examiner—Jennifer M. Kennedy
(74) Attorney, Agent, or Firm—Mueting, Raasch & Gebhardt, P.A.

(57) ABSTRACT

The present invention provides a method for forming a dielectric film, e.g., a barium-strontium-titanate film, preferably having a thickness of less than about 600 Å. According to the present invention, the dielectric film is preferably formed using a chemical vapor deposition process in which an interfacial layer and a bulk layer are formed. The interfacial layer has an atomic percent of titanium less than or equal to the atomic percent of titanium in the bulk layer. Such films are particularly vantageous for use in memory devices, such as dynamic random access memory (DRAM) devices.

35 Claims, 1 Drawing Sheet

U.S. PATENT DOCUMENTS

| | | | |
|---|---|---|---|
| 5,656,329 A | | 8/1997 | Hampden-Smith et al. |
| 5,663,089 A | * | 9/1997 | Tomozawa et al. ......... 427/576 |
| 5,719,417 A | | 2/1998 | Roeder et al. |
| 5,723,361 A | * | 3/1998 | Azuma et al. ............. 437/180 |
| 5,731,948 A | | 3/1998 | Yializis et al. |
| 5,736,759 A | | 4/1998 | Haushalter |
| 5,776,254 A | | 7/1998 | Yuuki et al. |
| 5,783,253 A | * | 7/1998 | Roh ............................ 438/81 |
| 5,798,903 A | | 8/1998 | Dhote et al. |
| 5,976,990 A | | 11/1999 | Mercaldi et al. |
| 5,989,927 A | * | 11/1999 | Yamonobe .................... 438/3 |
| 6,037,205 A | | 3/2000 | Huh et al. |
| 6,043,526 A | | 3/2000 | Ochiai |
| 6,046,345 A | | 4/2000 | Kadokura et al. |
| 6,078,492 A | | 6/2000 | Huang et al. |
| 6,101,085 A | * | 8/2000 | Kawahara et al. .......... 361/312 |
| 6,153,898 A | | 11/2000 | Watanabe et al. |
| 6,215,650 B1 | | 4/2001 | Gnade et al. |
| 6,258,654 B1 | | 7/2001 | Gocho |
| 6,285,051 B1 | * | 9/2001 | Ueda et al. ................. 257/296 |
| 6,287,935 B1 | | 9/2001 | Coursey |

OTHER PUBLICATIONS

Yamamichi et al., Abstract, "(Ba+Sr)/Ti ratio dependence of the dielectric properties for $(Ba_{0.5})Sr_{0.5}TiO_3$ thin films prepared by ion beam sputtering", *Applied Physics Letters*, 64(13):1644–1646 (1994).

Yamamuka et al., Abstract, "Thermal–Desorption Spectroscopy of $(Ba,Sr)TiO_3$ Thin–Films Prepared by Chemical–Vapor–Deposition", *Jpn. J. of Appl. Phys.*, 35(pt. 1 No. 2A):729–735 (1996).

S. Stemmer et al., "Accomodation of nonstoichiometry in (100) fiber–textured $(Ba_xSr_{1-x})Ti_{1+y}O_{3+z}$ thin films grown by chemical vapor deposition," *Applied Physics Letters*, 74:(17) 2432–2434 (1999).

S. K. Streiffer et al., "Ferroelectric in thin films: The dielectric response of fiber–textured $(Ba_xSr_{1-x})Ti_{1+y}O_{3+z}$ thin films grown by chemical vapor deposition," *J. of Applied Physics*, 86:(8) 4565–4575 (1999).

Basceri, "Electrical and Dielectric Properties of (Ba,Sr)TiO3 Thin Film Capacitors for Ultra–High Density Dynamic Random Access Memories," *A dissertation submitted to the Graduate Facullty of North Carolina State University*, pp. 1–171 (1997).

Basceri et al., "The dielectric response as a function of temperature and film thickness of fiber–textured $(Ba,Sr)TiO_3$ thin films grown by chemical vapor deposition," *J. Appl. Phys.*, 82(5), 2497–2503 (1997).

\* cited by examiner

DIELECTRIC FILMS AND METHODS OF FORMING SAME

FIELD OF THE INVENTION

This invention relates to the preparation of semiconductor device structures. Particularly, the present invention pertains to dielectric films and methods of forming dielectric films, such as barium-strontium-titanate films.

BACKGROUND OF THE INVENTION

Various dielectric films have been formed in the past during the fabrication of semiconductor devices. For example, films such as silicon dioxide and silicon nitride have been used for dielectric films in the formation of capacitors, such as for memory devices, including, for example, dynamic random access memories (DRAMs).

With the shrinkage of minimum feature sizes of semiconductor devices, the requirement of providing high capacitance with thinner films is becoming apparent. As the dielectric constant of silicon dioxide and silicon nitride are relatively low, the need for utilizing higher dielectric constant films, such as tantalum pentoxide and barium strontium titanate arises. Such high dielectric constant films provide the ability to achieve a larger capacitance value in a smaller area, e.g., with a thinner dielectric film. In other words, as memory devices become more dense, it is necessary to decrease the size of circuit components forming such devices. One way to retain storage capacity of storage cell capacitors of the memory devices and at the same time decrease the' memory device size is to increase the dielectric constant of the dielectric layer of the storage cell capacitor. Additionally, as high density packing of devices increases, development of thinner dielectric films with a high dielectric constant and good physical and electrical properties is desired.

Ferroelectric thin films, such as barium-strontium-titanates (BST), for example, deposited on semiconductor wafers have recently gained interest for use in memory devices. Generally, these materials have high dielectric constants. However, the dielectric properties of such films are dependent on various film characteristics such as thickness. For example, the dielectric properties of conventional BST thin films are undesirably affected as the thickness of such films is decreased, e.g., decreasing dielectric constant with decreasing thickness. Such dielectric response of BST is described in the article, entitled "The dielectric response as a function of temperature and film thickness of fiber-textured $(Ba,Sr)TiO_3$ thin films grown by chemical vapor deposition," *J.Appl.Phys.* 82 (5), Sep. 1, 1997; see also, Basceri, C., *Electrical and Dielectrical Properties of (Ba, Sr)TiO3 Thin Film Capacitors for Ultra-High Density Dynamic Random Access Memories*, (Ph.D. dissertation, 1997).

SUMMARY OF THE INVENTION

The present invention addresses thickness dependence of dielectric properties of dielectric constant materials, for example, such as high dielectric BST films. Methods for forming effective dielectric films, methods of forming structures incorporating such layers, e.g., the use of a thin dielectric film in a capacitor, and other methods associated therewith and structures formed thereby are described herein.

A method for use in fabrication of integrated circuits according to the present invention includes providing a substrate assembly having a surface and forming a barium-strontium-titanate film on at least a portion of the surface. The barium-strontium-titanate film includes an interfacial layer having an atomic percent of titanium less than or equal to the atomic percent of titanium in a bulk layer of the film.

In various embodiments of the method, the bulk layer of the barium-strontium-titanate film may include from about 50.0 atomic percent to about 53.5 atomic percent titanium, the interfacial layer may include from about 1 atomic percent to about 3 atomic percent titanium less that the bulk layer, the barium-strontium-titanate film may be less than about 600 Å, and/or the interfacial layer may include a greater atomic percent of barium relative to the atomic percent of strontium.

In another embodiment of the method, forming the barium-strontium-titanate film may include decreasing a flow rate of a titanium-containing organometallic precursor to a deposition chamber during a first predetermined time period for forming the interfacial layer relative to the flow rate of the titanium-containing organometallic precursor during a predetermined time period for forming the bulk layer.

In another embodiment the method, forming the barium-strontium-titanate film may include increasing the total flow rate of a barium-containing organometallic precursor and a strontium-containing organometallic precursor to a deposition chamber during a first predetermined time period for forming the interfacial layer relative to the total flow rate of the barium-containing organometallic precursor and the strontium-containing organometallic precursor during a predetermined time period for forming the bulk layer.

In another embodiment of the method, the interfacial layer is formed in less than about 50 seconds after initially providing the organometallic precursors to the chemical vapor deposition chamber.

A method for use in formation of a capacitor according to the present invention is also provided. The method includes providing a first electrode having a surface and forming a barium-strontium-titanate dielectric film on at least a portion of the surface of the first electrode. The barium-strontium-titanate film includes an interfacial barium-strontium-titanate layer on at least a portion of the surface of the first electrode and a bulk barium-strontium-titanate layer comprising from about 50 atomic percent to about 53.5 atomic percent titanium. The interfacial layer includes about 1 atomic percent to about 3 atomic percent less titanium that the bulk dielectric film. A second electrode is then formed on at least a portion of the barium-strontium-titanate dielectric film.

In one embodiment of the method, the interfacial layer has a thickness of less than half of a total thickness of the dielectric film.

A method of forming a titanium-containing dielectric film according to the present invention includes forming a titanium-containing interfacial dielectric layer on a substrate assembly surface and forming a titanium-containing bulk dielectric layer thereon. The atomic percent titanium in the interfacial layer is less than or equal to the atomic percent of titanium in the bulk layer.

In various embodiments of the method, the dielectric film may include a material selected from the group consisting of $BaSrTiO_3$; $BaTiO_3$; $SrTiO_3$; $PbTiO_3$; $Pb(Zr,Ti)O_3$; $(Pb,La)(Zr,Ti)O_3$; $(Pb,La)TiO_3$; and a combination thereof. Preferably, the dielectric film includes a $BaSrTiO_3$ film and the interfacial dielectric layer comprises from about 1 atomic percent to about 3 atomic percent less titanium than the bulk dielectric layer.

In another embodiment of the method, forming the titanium-containing interfacial layer includes providing a first organometallic precursor and a titanium-containing organometallic precursor to a chemical vapor deposition chamber containing the substrate assembly. The concentration of the first organometallic precursor and the titanium-containing organometallic precursor in the chemical vapor deposition chamber is such that an equal or higher dielectric constant is attained for the interfacial layer relative to the bulk layer.

Yet further, another method of providing a dielectric film according to the present invention is described. The method includes forming a dielectric film using one or more organometallic precursors by forming an interfacial dielectric layer on a substrate assembly surface using the one or more organometallic precursors and forming a bulk dielectric layer on the interfacial dielectric layer. The atomic percent of at least one metal component present in the interfacial layer is controlled such that an equal or higher dielectric constant is attained for the interfacial dielectric layer relative to the bulk dielectric layer.

In one embodiment of the method, the atomic percent of at least one metal present in the interfacial layer is controlled by controlling a flow rate of at least one of the one or more organometallic precursors to a chemical vapor deposition chamber.

In another embodiment of the method, the interfacial layer is formed in an early nucleation stage after initially providing the one or more organometallic precursors to a chemical vapor deposition chamber. Preferably, the interfacial layer is formed in less than about 50 seconds after initially providing the one or more organometallic precursors to the chemical vapor deposition chamber.

A capacitor structure according to the present invention includes a first conductive electrode and a titanium-containing dielectric film formed thereon. The titanium-containing dielectric film formed thereon includes an interfacial layer formed on at least a portion of the first conductive electrode and a bulk layer formed on the interfacial layer. An amount of titanium in the interfacial layer is less than or equal to an amount of titanium in the bulk layer. Further, the capacitor structure includes a second conductive electrode formed on at least a portion of the titanium-containing dielectric film.

In various embodiments of the capacitor structure, the amount of titanium in the interfacial layer may be less than about 53.5 atomic percent, the titanium-containing dielectric film may be less than about 600 Å thick, the interfacial layer may include a greater atomic percent of barium relative to the atomic percent of strontium, and/or the interfacial layer may include a thickness of less than half of a total thickness of the dielectric film.

A dielectric film according to the present invention is also described. The dielectric film includes a titanium-containing interfacial layer and a titanium-containing bulk layer formed on the interfacial layer. The interfacial layer includes from about 1 atomic percent to about 3 atomic percent less titanium than the bulk layer.

Further, another capacitor structure is provided. The capacitor structure includes a first electrode and a barium-strontium-titanate dielectric film formed on at least a portion of the first electrode. The dielectric film includes an interfacial layer and a bulk layer such that the interfacial layer is in contact with the first electrode. An amount of titanium in the interfacial layer is less than or equal to an amount of titanium in the bulk layer. Further, the capacitor structure includes a second electrode formed on at least a portion of the bulk layer of the dielectric film.

In various embodiments of the structure, the bulk layer of the barium-strontium-titanate dielectric film includes from about 50.0 atomic percent to about 53.5 atomic percent titanium, the amount of titanium in the interfacial layer is about 1 atomic percent to about 3 atomic percent less than the bulk layer, the interfacial layer includes a greater atomic percent of barium relative to an atomic percent of strontium, and/or the interfacial layer is less than half of a total thickness of the barium-strontium-titanate dielectric film.

These and other objects, features and advantages of the present invention, e.g., use of the capacitor structure in a memory cell, will be apparent from the following description of various embodiments and as illustrated in the accompanying figures.

DETAILED DESCRIPTION OF THE PREFERRED EMBODIMENTS

The present invention provides a method for forming a dielectric film, preferably a high dielectric film such as a $Ba_y Sr_{(1-y)} TiO_3$ [barium-strontium-titanate or BST] film. "High dielectric constant" as used herein generally refers to a dielectric constant preferably greater than about 20. Preferably, according to the present invention, a BST film is formed as a thin dielectric film, preferably having a thickness less than about 600 Å and, more preferably, having a thickness from about 100 Å to about 300 Å. However, BST films and other dielectric films having a thickness greater than 600 Å may also benefit from the present invention. Advantageously, the dielectric film is one that can be used in memory devices, such as DRAM devices.

It has been found that BST dielectric films possess a "size dependent" dielectric constant in both bulk films (i.e., those BST films having a thickness of more than about 600 Å) and in thin films (i.e., those BST films having a thickness of less than about 600 Å). As such, this thickness dependence causes storage capacitance of a capacitor incorporating such a film not to increase as expected when film thickness is decreased. In particular, it has been observed that a sharp decrease in dielectric constant has been observed as the film thickness decreases. See, Basceri, C., *Electrical and Dielectrical Properties of (Ba,Sr)TiO3 Thin Film Capacitors for Ultra-High Density Dynamic Random Access Memories*, Chapter 6 (Ph.D. dissertation, 1997).

While not wishing to be bound by any particular theory, it is believed that the stoichiometry of the very first nucleation layer in a BST film is very important to storage capacitance of the film. The relationship between storage capacitance versus BST film thickness indicates that there is an "interfacial layer" capacitance in series with the capacitance of the remainder of the film (referred to herein as a "bulk layer"). In other words, the interfacial layer has a dielectric constant that is lower than the bulk layer of the film. Furthermore, it has been observed that the dielectric constant decreases as the atomic % of titanium increases in a BST film. As such, and according to the present invention, it is determined that this interfacial layer in conventionally deposited BST films is rich in titanium compared to the bulk layer of the film. Therefore, in accordance with the present invention, a method is provided for controlling the stoichiometry of an interfacial layer such that the interfacial layer does not have a dielectric constant lower than the remainder of the film (i.e., bulk layer). Preferably, by controlling the amount of at least one of barium-, strontium-, and titanium-containing precursors, less titanium can be delivered at a very early stage of a deposition process for forming a BST film relative to the amount of titanium delivered later in the process.

Typically, this lesser amount of titanium is delivered in the very early stages of nucleation in the deposition process to control the dielectric constant of the interfacial layer and, as such, the overall dielectric constant and storage capacitance of the film being formed. The very early stages of nucleation may correspond to the first 50 seconds of deposition. Although 50 seconds is given as a particular time period corresponding to the early stages of nucleation, such a time period will depend upon various factors, including, but clearly not limited to, the deposition rate, the nucleation layer thickness, and the various parameters which affect such factors. As such, the early stages of nucleation may be less than the first 15 seconds of deposition. For example, the nucleation thickness may change greatly depending upon various parameters, such as, for example, the deposition process conditions and the thickness of the bulk layer.

Figure 1:
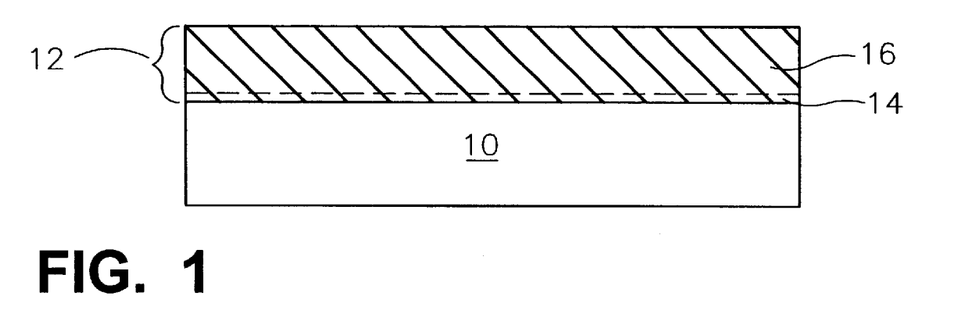
FIG. 1 is a cross-section schematic of a dielectric film in accordance with the present invention.

An illustrative dielectric film formed in accordance with the present invention is generally shown in FIG. 1. The dielectric film 12 can be formed on a surface of a substrate assembly 10.

As used herein, "substrate assembly" refers to either a semiconductor substrate such as the base semiconductor layer, e.g., the lowest layer of a silicon material on a wafer, or a silicon layer deposited on another material, such as silicon on sapphire, or a semiconductor substrate having one or more films, layers, or structures formed thereon or regions formed therein. When reference is made to a "substrate assembly" in the following description, various process steps may have been previously used to form or define regions, junctions, various structures or features, and openings such as vias, contact openings, high aspect ratio openings, etc.

Figure 2:
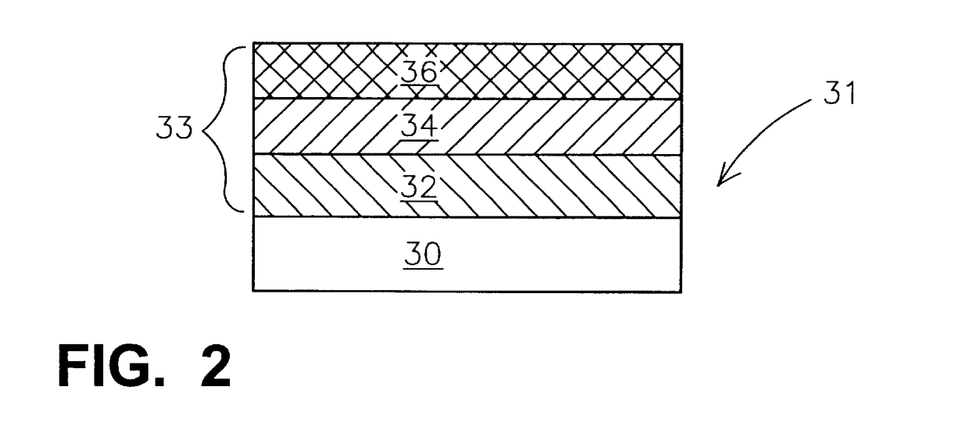
FIG. 2 is a cross-sectional schematic of one embodiment of a capacitor structure including a film formed in accordance with the present invention.

For example, as used herein, substrate assembly may refer to a structure upon which a dielectric film of a capacitor structure is formed as shown in FIG. 2. Further, such a substrate assembly, e.g., substrate assembly 10 as shown in FIG. 1, may generally include electrode materials such as, for example, platinum, platinum rhodium, ruthenium, ruthenium oxide, iridium, iridium oxide, palladium, titanium nitride, tungsten nitride, titanium oxynitride, and various combinations of layers thereof. For example, such electrode materials may generally be positioned between the dielectric film according to the present invention and a silicon containing material (e.g., silicon, polysilicon) so as to prevent diffusion of silicon into the dielectric material of the film. If such diffusion of silicon into the dielectric material was allowed, formation of silicon dioxide may occur leading to degradation of the dielectric properties of the film.

As used herein, "film" refers to a substantially continuous sheet of a composition. Film is to be distinguished from a layer in that a "layer" can be a stratum of the film so that a film may include one, two or more layers.

Preferably, the dielectric film 12 includes an interfacial layer 14 and a bulk layer 16. As indicated above, preferably, the interfacial layer 14 is formed by controlling the amount of precursors in the reaction chamber during formation such that the interfacial layer 14 does not have a dielectric constant lower than the bulk layer 16. As such, the ratios of components, e.g., metals, in the films can be controlled such that, preferably, the interfacial layer 14 does not have a dielectric constant lower than the bulk layer 16, i.e., the dielectric constant of the interfacial layer is equal to or greater than the dielectric constant of the bulk layer 16.

With regard to BST films, $(BaSr)TiO_3$ used to form such films is an $ABO_3$-type perovskite structure. As such, and in accordance with the present invention, preferably the ratio (Ba, Sr)/Ti is controlled to achieve the desired dielectric constant results. However, further, the ratio Ba/Sr may be controlled to achieve the desired dielectric constant results. Yet further, control of both such ratios may be used to achieve the desired dielectric constant results.

Preferably, with respect to the (Ba, Sr)/Ti ratio, the interfacial layer 14 includes an atomic percent (abbreviated "at %" herein) titanium that is less than or equal to an atomic percent titanium in the bulk layer 16. Further, with respect to the Ba/Sr ratio, interfacial layer 14 includes a greater atomic percent of barium relative to the atomic percent of strontium, i.e., the Ba/Sr ratio is greater than 1.

Further, more preferably, with respect to the (Ba, Sr)/Ti ratio, if the atomic percent of titanium in the bulk layer 16 is represented by X, then preferably the atomic percent of the interfacial layer 14 can be represented as being in the range of X-1 at % to X-3 at %. In many applications, for example, it is preferred that the dielectric film contain a target atomic percent from about 50.0 at % titanium to about 53.5 at % titanium. Therefore, X is preferably from about 50.0 to about 53.5, assuming that the target at % titanium of the dielectric film is equivalent to the at% of the bulk layer 16. As such, the interfacial layer 14 preferably is targeted to contain from about 1 at % to about 3 at % less titanium than the bulk layer 16. For example, if the target at % titanium in a dielectric film 12 is about 53 at %, then the interfacial layer 14 is preferably targeted to contain from about 50.0 at % to about 53.0 at % titanium. Further, for example, if the target at % is about 50.5 at %, then the interfacial layer 14 is preferably targeted to contain from about 47.5 at % titanium to about 50.5 at % titanium (preferably, less than 50.5%).

Substantial portions of the description herein are directed to the control of titanium at % in a BST film. However, the overall general concept of controlling the at % of one or more elements in the interfacial layer 14 relative to the bulk layer 16 of a dielectric film 12 to prevent the composition of the interfacial layer from degrading the dielectric constant of the dielectric film 12, and therefore the capacitance of a capacitor structure including the dielectric film 12, is applicable to other dielectric films as well as the BST films. For example, such control of the at % of one or more metal components in any metal-containing dielectric film, e.g., a dielectric film formed using one or more organometallic precursors, may be used to prevent the stoichiometry of the interfacial layer 14 from degrading the dielectric constant of the dielectric film 12. For example, control of the at % of one or more of Ti, Ba, Sr, Pb, Zr, Bi, La, K, Li, Nb, or Ta in the formation of the interfacial layer 14 relative to the bulk layer 16 of a dielectric film 12 such as, for example, $Ta_2O_5$, $BaTiO_3$, $SrTiO_3$, $PbTiO_3$, $Pb(Zr,Ti)O_3$ [lead-zirconium-titanate or PZT], $(Pb,La)(ZrTi)O_3$ [PLZT], $(Pb,La)TiO_3$ [PLT], $KNO_3$, $LiNbO_3$, $(Sr_xBi_{1-x}Ta_7O_9)$ [strontium bismuth tantalate or SBT], $SrBiNbTaO$ [strontium bismuth niobium tantalate or SBTN], and $SrBiNb$ [strontium bismuth niobium or SBN], may be used to prevent the stoichiometry of an interfacial layer 14 of such dielectric films from degrading the dielectric constant thereof. For example, it may be desirable to control the tantalum at % in the interfacial layer of an SBT film, the tantalum at % of a $Ta_2O_5$ film, or the Pb at % of a PZT film.

However, for simplicity, the remainder of description herein focuses particularly on the BST film. One skilled in the art will recognize that the applicable concepts described with regard to the BST film may be translated to the other films as well.

A. Film Formation Method

The present invention broadly relates to the formation of a dielectric constant film 12, preferably to high dielectric film, and also preferably to films having a thickness of less than about 600 Å. In the present invention, one preferred method for forming the film is chemical vapor deposition (CVD), although it may be possible to use other such as sputtering. Chemical vapor deposition is one process various processes for forming relatively thin films on semiconductor wafers, such as films of elemental metals or compounds. "CVD," as used herein, means the formation of a nonvolatile solid layer or film on a surface by the reaction of vapor phase reactants that contain desired components. The vapors are introduced into a reactor vessel or chamber, and decompose and/or react at a surface on a wafer to form the desired film.

For example, a compound, typically a heat decomposable volatile compound (also known as a precursor), is delivered to a substrate surface in the vapor phase. The precursor is contacted with a surface which has been heated to a temperature above the decomposition temperature of the precursor. A coating or film forms on the surface. The film generally depends upon the type of precursor and deposition conditions employed.

CVD can be classified into various types in accordance with the heating method, gas pressure, and/or chemical reaction. For example, conventional CVD methods include: (a) cold wall type CVD, in which only a deposition substrate is heated; (b) hot wall type CVD, in which an entire reaction chamber is heated; (c) atmospheric CVD, in which reaction occurs at a pressure of about one atmosphere; (d) low-pressure CVD in which reaction occurs at pressures, for example, from about $10^{-1}$ to 100 torr; (e) electron-beam assisted CVD and ion-beam assisted CVD in which the energy from an electron-beam or an ion-beam directed towards the substrate provides the energy for decomposition of the precursor; (f) plasma assisted CVD and photo-assisted CVD in which the energy from a plasma or a light source activates the precursor to allow depositions at reduced substrate temperatures; and (g) laser assisted CVD wherein laser light is used to heat the substrate or to effect photolytic reactions in the precursor gas. In the cold wall type CVD, heating of substrates in a CVD reactor may be accomplished by several methods including the use of hot stages or induction heating.

In an exemplary CVD process, a substrate assembly on which deposition is to occur is placed in a reaction chamber, and is heated to a temperature sufficient to cause the decomposition of vapors of the precursor. For example, precursors used in CVD of dielectric films may be organometallic compounds, wherein a hydrocarbon portion of the precursor functions as the carrier for the metal or metalloid portion of the precursor during vaporization of the liquid precursor. Thus, CVD is generally a process in which a film or layer is deposited by a chemical reaction or decomposition of a gas mixture at elevated temperature at a substrate assembly surface or in its vicinity. When the vapors of the precursor are introduced into the reaction chamber and transported to the vicinity of the surface, they will decompose thereon to deposit a layer or film. Typically, CVD can be used to provide blanket deposition of layers or films on surfaces, as well as to provide deposition of these materials on selected areas of the substrate assembly, e.g., by use of a masking material, such as a resist material.

Any CVD apparatus design may be used in the present invention including hot wall reactors, cold wall reactors, radiation beam assisted reactors, plasma assisted reactors, and the like. For blanket deposition, a cold wall-hot substrate reactor may sometimes be preferred as this design is efficient in regards to precursor consumption. For example, the CVD processes described herein may be carried out in a chemical vapor deposition reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing CVD may be used.

Preferably, a method for forming a dielectric film from organometallic precursors is carried out where the precursor (s) may be a liquid or a solid at room temperature. Typically, however, such precursors are liquids. If they are solids, they are preferably sufficiently soluble in an organic solvent or have melting points below their decomposition temperature such that they can be used in flash vaporization, bubbling, microdroplet formation techniques, etc. However, they may also be sufficiently volatile that they can be vaporized or sublimed from the solid state using known chemical vapor deposition techniques. Thus, the precursor composition of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material. Preferably, however, there is a sufficient amount of the material that can be carried by the organic solvent into the vapor phase for chemical vapor deposition processing.

If the metal precursor is a liquid, it may be delivered through use of bubbling techniques. Generally, with the use of a bubbling technique for delivery, the liquid precursor is contained in a bubbler reservoir through which a carrier gas, such as helium or any other inert gas, i.e., a gas that is nonreactive with other gases in the process (e.g., nitrogen, argon, neon, and xenon) is passed. In other words, the carrier gas is bubbled through the reservoir containing the precursor to deliver the precursor to the reaction chamber. If a carrier gas is used, it is preferably supplied to the reaction chamber at a rate up to about 500 sccm.

Preferably, CVD of BST films is accomplished using a liquid delivery system. In such a system, organometallic precursors (e.g., barium-betadiketonates, strontium-betadiketonates and titanium-betadiketonates, for BST films) are dissolved in a high vapor pressure solvent (e.g., tetrahydrofuran, butylacetate, etc.) to form a solution of organometallic precursor. This solution is then delivered to a vaporizer wherein vaporization is performed with a vaporized precursor is delivered into the chamber. Preferably, the solution is delivered to the vaporizer using a controllable device, such as a micropump. Although one or more precursors may be premixed prior to being delivered to the vaporizer by the controllable device, e.g., a mixture of barium-containing precursor and a strontium-containing precursor, it may be desirable for other precursors to be provided separately to the vaporizer by controllable devices, e.g., a titanium-containing precursor and a strontium-containing precursor.

Generally, the reaction chamber and the substrate assembly surface upon which deposition is to occur are maintained at a preselected temperature, by, for example, an external furnace or an internal heater chuck. In conventional CVD processes, the preselected temperature is generally effective to decompose the precursor vapor so as to deposit a layer or film on the exposed surfaces of the substrate assembly. In a conventional reaction chamber for depositing a dielectric layer, e.g., BST, the temperature is generally maintained between about 200° C. and about 700° C., preferably in the range of about 400° C. to about 700° C. for forming a BST film.

Generally, vacuum systems are used for CVD of the dielectric films. There is a wide range of operating conditions with respect to the pressure in the system. Operating pressures of 1 to 1000 mtorr have been used in the absence of carrier gas and higher or lower pressures are also acceptable, e.g., up to about 10 torr. These pressures are largely dependant on, for example, the pumping speed of the vacuum equipment, the chamber volume, and the vapor pressure of the precursor.

The deposition of the dielectric film, e.g., BST, may be accomplished in the presence of an oxidant added to the reaction chamber in accordance with the present invention. The oxidant is typically in the form of a gas. More preferably, the oxidant is an oxygen-containing gas selected from the group consisting of air, oxygen, ozone, $N_2O$, NO, $SO_3$, $H_2O_2$, $R_2O_2$, and a combination thereof, wherein R is selected from the group consisting of a saturated or unsaturated linear, branched or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like. While not intending to be bound by any particular theory, it is believed that the oxidant facilitates the oxidation of the organic portion of the organometallic precursor to produce volatile by-products and thus prevent incorporation of carbon into the resulting film. Preferably, the oxidant is provided to the reaction chamber at a rate of about 1 sccm to about 5000 sccm.

A diluent gas may also be provided to the reaction chamber. For example, the diluent gas may be an inert gas such as helium, argon, nitrogen, neon, Krypton, xenon, and mixtures thereof.

For carrying out CVD, the substrate assembly 10, e.g., wafers including previously formed electrode materials for formation of capacitor structures, upon which a dielectric film is to be deposited, are placed in a reaction chamber at the required deposition temperature. The vaporized organometallic precursors are delivered to the reaction chamber and the surface upon which a dielectric film is to be deposited is exposed to the vapors for a time sufficient to produce a film, e.g., a couple of minutes, that has suitable effective dielectric properties. The deposition time depends on various factors such as the desired thickness of the film, the deposition rate, etc. Preferably, a BST dielectric film so formed has a thickness of less than about 600 Å, and more preferably from about 100 Å to about 300 Å. Preferably, such aBST film is deposited at a rate in the range of about 50 Å/minute to about 100 Å/minute.

B. Organometallic Precursor

As discussed above, film formation in accordance with the present invention is preferably accomplished using one or more organometallic precursors. "Organometallic precursor," as used herein, means a mononuclear (i.e., monomer) compound having an organic portion and a metallic portion. Various combinations of compounds described herein can be used in the precursor for chemical vapor deposition. Thus, as used herein, a "precursor" refers to a liquid or solid that includes one or more compounds of the type described herein. The precursor can also include one or more organic solvents suitable for use in chemical vapor deposition, as well as other additives.

As used herein, "organic portion" means a hydrocarbon group that is classified as an aliphatic group, cyclic group, or a combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group, including, for example, methyl, ethyl, isopropyl, t-butyl, heptyl, dodecyl, octadecyl, amyl, 2-ethylhexyl, and the like. The term "alkenyl group" means an unsaturated linear or branched hydrocarbon group with one or more carbon-carbon double bonds, such as a vinyl group. The term "alkynyl group" means an unsaturated linear or branched hydrocarbon group with one or more triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

The term "group" is used to describe a chemical substituent that includes the unsubstituted group and the group with nonperoxidic O, N, or S atoms, for example, in the chain as well as carbonyl groups or other conventional substitution. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxylalkyls, hydroxylalkyls, sulfoalkyls, etc. For example, suitable organic groups used in the fabrication of semiconductor devices include cyclopentadienyl, 1,5 cyclooctadiene, and acetylacetonate groups.

An organometallic precursor useful for forming dielectric films in accordance with the present invention preferably includes a metal portion preferably selected from the group consisting of an alkaline earth metal, a rare metal, a heavy metal, and a combination thereof. For example, the metal may be barium, strontium, zirconium, titanium, tantalum, and lead.

In forming a dielectric film in accordance with the present invention, preferably, more than one organometallic precursor is used. For example, when a titanium-containing dielectric film is being formed, one of the organometallic precursors is a titanium-containing organometallic precursor and in most cases another organometallic precursor is provided. Thus, in forming a BST film in accordance with the present invention, three organometallic precursors are usually required, i.e., a barium-containing organometallic precursor, a strontium-containing organometallic precursor, and a titanium-containing organometallic precursor. For example, suitable organometallic precursors used in forming a BST film are barium-betadiketonates, strontium-betadiketonates and titanium-betadiketonates. Further, for example, the titanium-betadiketonates may include titanium-tetramethylheptanedionates (THD), e.g., titanium-tert butoxy THD, titanium-methoxy THD, titanium-isopropoxy THD.

Although, each of the precursors may be provided separately to the reaction chamber for CVD, several of the precursors may be mixed depending upon the dielectric film being formed. For example, although the barium-containing organometallic precursor, the strontium-containing organometallic precursor, and the titanium-containing organometallic precursor may be provided separately to attain the desired (Ba+Sr)/Ti ratio in the dielectric film, the barium-containing organometallic precursor and strontium-containing organometallic precursor may be mixed in a single container at a given Ba/Sr ratio. The titanium-containing organometallic precursor may then be contained in another container. The desired (Ba+Sr)/Ti ratio can then be attained by changing the flows from the two containers. Further, a desired Ba/Sr ratio for a particular desired (Ba+Sr)/Ti ratio can also be easily controlled and attained. Such a Ba/Sr ratio is also important in eliminating interfacial layer capacitance problems.

Preferably, to form a dielectric BST film 12 (preferably, a dielectric film having a thickness less than about 600 Å, although the present invention provides benefit for dielectric films thicker than 600 Å), as shown in FIG. 1, having improved dielectric properties, it is desirable to deposit in the early stages of nucleation of the deposition process (e.g., the first 50 seconds) a BST layer 14 having an atomic percent titanium in the range of about X-1 at % to about X-3 at %), wherein X has a value from about 50.0 to about 53.5 and is representative of the target % of titanium in the entire dielectric film 12, e.g., including the bulk layer 16. The BST layer 14 formed in the early stages of nucleation of CVD deposition (e.g., the first 50 seconds) is referred to as the interfacial layer 14 and typically does not constitute a major portion of the BST film 12. That is, the interfacial layer 14 preferably comprises less than about half of the total thickness of the BST film 12, e.g., the interfacial layer 14 has a thickness of less than about 300 Å if the total film 12 thickness is about 600 Å. The interfacial layer 14 may be very thin, even down to about 10 Å.

Once the interfacial layer 14 is formed, the remainder of the dielectric film 12, i.e., the bulk layer 16, is deposited, preferably in a continuous CVD process with the deposition of the interfacial layer 14. However, it is possible that such layers be deposited in a multiple step deposition process. Preferably, the bulk layer 16 includes from about 50.0 at % titanium to about 53.5 at % titanium. Accordingly, the present invention preferably results in the formation of a controlled interfacial layer 14 (e.g., a titanium deficient layer relative to the bulk layer 16) having a dielectric constant that is greater than or equal to the dielectric constant of the bulk layer 16, which may be effective in reducing/eliminating the apparent thickness dependence of the dielectric constant in BST films. In other words, this provides the desired ratio of (Ba+Sr)/Ti in the interfacial layer 14 relative to the ratio of (Ba+Sr)/Ti in the bulk layer 16 for attaining desirable dielectric properties for the BST film 12.

Further, according to the present invention, for a given target titanium at %, controlling the ratio of barium to strontium (Ba/Sr) may also be used to reduce or even eliminate interfacial layer dielectric constant problems. The formation of a strontium deficient layer (i.e., a barium rich film) in the early stages of nucleation provides for such results. Preferably, the ratio Ba/Sr in the film in the early stages of nucleation (i.e., in the interfacial layer 14) is greater than 1 (i.e., at least some portion more of Ba in the layer 14 than Sr).

In summary, therefore, controlling the content of the interfacial layer 14 of the dielectric film 12 relative to the bulk layer 16 of the dielectric film 12 provides for desirable reduction/elimination of size effect problems as described herein. In a BST film, such control of the content of the interfacial layer is provided by controlling the ratio of the (Ba, Sr)/Ti in the interfacial layer 14 and/or may be controlled by controlling the Ba/Sr ratio for a particular (Ba, Sr)/Ti ratio (i.e., a given titanium at %). Preferably, both the (Ba, Sr)/Ti ratio and the Ba/Sr ratio are controlled.

One with skill in the art will appreciate that to achieve the desired ratios as described above (e.g., the desired Ba, Sr, and Ti content), various techniques may be used. Preferably, the concentration of the titanium-containing precursor is adjusted relative to the other organometallic precursors at the early stages of nucleation in the deposition process (e.g., during the first 50 seconds of deposition) relative to the concentration of titanium-containing precursor during formation of the bulk layer 16 of the film 12. By decreasing the amount of titanium-containing precursor in the reaction chamber during such early stages, the content of titanium in the film can be decreased resulting in an increase in the dielectric constant of the interfacial layer 14. Such control of the concentration of the titanium-containing precursor during the deposition process is preferably controlled by controlling the flow of the precursors to the reaction chamber. For example, the flows of the barium-containing organometallic precursor, the strontium-containing organometallic precursor, and the titanium-containing organometallic precursor may be controlled separately to attain the desired (Ba+Sr)/Ti ratio in the dielectric film and/or the desired Ba/Sr ratio in the dielectric film. Further, for example, as previously described herein, the barium-containing organometallic precursor and strontium-containing organometallic precursor may be mixed in a single container to attain the desired Ba/Sr ratio and the flow of the mixed barium-containing organometallic precursor/strontium-containing organometallic precursor and the flow of the titanium-containing organometallic precursor may be controlled to attain the desired (Ba+Sr)/Ti ratio in the dielectric film. For example, to decrease the titanium content in the interfacial layer 14, a decreased flow rate of the titanium-containing organometallic precursor may be used relative to that used for the bulk layer 16. Further, the flow rate of one or both of the barium-containing organometallic precursor and the strontium-containing organometallic precursor may be increased in forming the interfacial layer 14 relative to the flow rate of such precursors in the formation of the bulk layer 16.

One skilled in the art will recognize that various deposition parameters or conditions can be varied to control the amount of the precursors in the reaction chamber. For example, increasing the temperature or pressure of a bubbler reservoir may increase the amount of a precursor delivered to the reaction chamber.

One with skill in the art will appreciate that to achieve a similar effect in other titanium-containing dielectric films, if the stoichiometry of the interfacial layer 14 plays a role in the films' properties, the concentration of the titanium-containing precursor could be adjusted relative to the other organometallic precursors at the beginning of deposition process (e.g., during the first 50 seconds of deposition) to increase the dielectric constant of the interfacial layer 14 prior to depositing the bulk layer 16. Further, the overall general concept of controlling the at % of one or more elements in the interfacial layer 14 relative to the bulk layer 16 of a dielectric film 12 is applicable to other dielectric films as well as titanium-containing dielectric films. For example, as previously described herein, such interfacial layer compositional control of one or more metal components in any metal-containing dielectric film, e.g., a dielectric film formed using one or more organometallic precursors, may be used to prevent the stoichiometry of the interfacial layer 14 from degrading the dielectric constant of the dielectric film 12; preferably, such metal-containing dielectric films are multiple metal component containing dielectric films formed using more than one organometallic precursors. For example, controlling one or more of barium, strontium, lead, zirconium, bismuth, tantalum, niobium, lithium, and lanthanum in the formation of a dielectric film 12, such as, for example, $Ta_2O_5$, $BaTiO_3$, $SrTiO_3$, $PbTiO_3$, $Pb(Zr,Ti)O_3$ [lead-zirconium-titanate or PZT], $(Pb,La)(Zr,Ti)O_3$ [PLZT], $(Pb,La)TiO_3$ [PLT], $KNO_3$, $LiNbO_3$, $(Sr_xBi_{1-x}Ta_7O_9)$ [strontium bismuth tantalate or SBT], SrBiNbTaO [strontium bismuth niobium tantalate or SBTN], and SrBiNb [strontium bismuth niobium or SBN], may be performed.

Preferably, the interfacial layer compositional control is used with thin films having a thickness of less than about 600 Å to combat the size effect problems described herein, i.e., increase in dielectric constant as the film gets thinner. However, such techniques may be applicable to films having larger thicknesses. For example, PZT films may be as thick as 3000 Å and may benefit from the techniques described herein.

After deposition, dielectric films can be analyzed using a conventional surface analytical technique, such as by x-ray photo electron spectroscopy (XPS), Auger electron spectroscopy (AES) or by transmission electron microscopy (using energy dispersive analyses) methods, to generate a depth profile to determine the relative proportions of titanium in the interfacial layer 14 and the bulk layer 16 of the dielectric film 12 formed in accordance with the present invention. As mentioned above, the interfacial layer 14 preferably includes a titanium amount that is less than or equal to that of the bulk layer 16. Preferably, the interfacial layer 14 includes from about 1 at % to about 3 at % titanium less than the bulk layer 16.

C. Substrate Assemblies

Any type of materials for the substrate assembly 10 can be used, including metals, graphite, semiconductors, insulators, ceramics and the like as long as the substrate assembly is not substantially deteriorated under the deposition conditions and the substrate assembly surface upon which the dielectric film according to the present invention is formed is compatible for providing benefit according the present invention. For example, for a capacitor structure, preferably, the substrate assembly 10 includes electrode materials such as those described previously herein and further below.

The present process can provide conformal deposition so that the material can be deposited as continuous films into recesses, trenches, and vias, and over stepped surfaces, such as those which are topologically microstructured including those that may have relatively high aspect ratios, as well as planar surfaces. The substrate assembly may have a surface of any desired shape, either regular or irregular. For example, such substrate assemblies upon which the film is deposited are preferably electrode surfaces for use in formation of capacitors such as planar cells, trench cells (e.g., double sidewall trench capacitors), stacked cells (e.g., crown, V-cell, delta cell, multi-fingered, or container stacked capacitors), such as described in U.S. Pat. No. 5,392,189 (Fazan et al.) or in U.S. Pat. No. 5,270,241 (Dennison, et al.).

Referring to FIG. 2, structure 31 includes a capacitor structure 33 formed relative to substrate assembly 30. The capacitor structure 33 includes a dielectric film 34 formed according to the present invention on a bottom electrode 32 deposited on the substrate assembly 30. The electrode 32 can be formed by any conventional method, such as by chemical vapor deposition, sputter coating, and the like. The electrode 32 is formed of one or more conductive materials. For example, the electrode 32 may be formed from one or more layers or films containing platinum, titanium, tantalum, ruthenium, osmium, iron, rhodium, cobalt, nickel, iridium, cerium, tungsten, aluminum, copper, palladium, and/or conductive nitrides or oxides thereof (e.g., oxides, nitrides, oxynitrides).

The electrode 32 can be deposited on one or more other layers or films of the substrate assembly 30. For example, the electrode 32 may be formed over a barrier film, which may itself be formed over another film, such as an adhesion film. Materials that may be used for such films may, for example, include TiN, Ti, W, Rh, Ru, Ir, $RhO_2$, $RuO_2$, $IrO_2$, TiON, TiSiN, WN, WSiN, TaN, TiAl, TaSiN, TiB, TiAlN, TiBN, WBN. It will be recognized by one skilled in the art that the electrode structure may be formed of multiple films or layers and from various materials. As such, the present invention is not limited to any particular electrode material.

A dielectric film 34 is preferably formed over the bottom electrode 32 according to the present invention as described herein. As mentioned above, for many devices, materials suitable for forming high dielectric constant material films are selected from the group of $Ta_2O5$, $Ba_ySr_{(1-y)}TiO_3$ [barium-strontium-titanate or BST], $BaTiO_3$, $SrTiO_3$, $PbTiO_3$, $Pb(Zr,Ti)O_3$ [lead-zirconium-titanate or PZT], $(Pb,La)(Zr,Ti)O_3$ [PLZT], $(Pb,La)TiO_3$ [PLT], $KNO_3$, $LiNbO_3$, $(Sr_xBi_{1-x}Ta_7O_9)$ [strontium bismuth tantalate or SBT], SrBiNbTaO [strontium bismuth niobium tantalate or SBTN], SrBiNb [strontium bismuth niobium or SBN] and a combination thereof. In one embodiment, a BST film formed in accordance with the present invention is formed directly over a film of platinum (e.g., a platinum bottom electrode).

In accordance with the present invention, the dielectric film 34 is preferably a titanium-containing dielectric film as described above with reference to FIG. 1. That is, the dielectric film 34 preferably includes an interfacial layer and a bulk layer, wherein the dielectric constant of the interfacial layer is preferably less than or equal to the dielectric constant of the bulk layer. In a BST dielectric film, for example, the interfacial layer preferably includes from about 1 at % to about 3 at % titanium less than the bulk layer.

The substrate assembly 30 may include various elements. For example, the substrate assembly may include field oxide regions, active regions (i.e., those regions of a silicon substrate not covered by field oxide) wherein active devices such as field effect transistors (FET) are formed, etc.

Following the formation of the dielectric film 34, an upper electrode 36 can be provided to form the storage capacitor structure 33. For example, the upper electrode 36 may be formed using CVD or sputtering. Preferably, the upper electrodes include a conductive material such as those described above with reference to electrode 32 or any other conductive material typically used as capacitor electrodes.

All patents, patent documents, and publications cited herein are incorporated by reference as if each were individually incorporated by reference. Various modifications and alterations of this invention will be apparent to those skilled in the art without departing from the scope of this invention, and it should be understood that this invention is not limited to the illustrative embodiments set forth herein.

What is claimed is:

1. A method for use in fabrication of integrated circuits, the method comprising:

providing a substrate assembly having a surface; and forming a barium-strontium-titanate film on at least a portion of the surface, wherein the barium-strontium-titanate film comprises an interfacial layer having an atomic percent of titanium less than the atomic percent of titanium in a bulk layer of the film and further wherein the bulk layer has a thickness greater than the interfacial layer.

2. The method of claim 1, wherein the bulk layer of the barium-strontium-titanate film comprises from about 50.0 atomic percent to about 53.5 atomic percent titanium.

3. The method of claim 2, wherein the interfacial layer comprises from about 1 atomic percent to about 3 atomic percent titanium less than the bulk layer.

4. The method of claim 1, wherein the barium-strontium-titanate film is less than about 600 Å thick.

5. The method of claim 1, wherein the interfacial layer comprises a greater atomic percent of barium relative to the atomic percent of strontium.

6. The method of claim 1, wherein forming the barium-strontium-titanate film comprises providing a barium-containing organometallic precursor, a strontium-containing organometallic precursor, and a titanium-containing organometallic precursor to a chemical vapor deposition chamber containing the substrate assembly, wherein a concentration of the barium-containing organometallic precursor, the strontium-containing organometallic precursor, and the titanium-containing organometallic precursor in the chemical vapor deposition chamber is such that the interfacial layer formed includes from about 1 atomic percent to about 3 atomic percent titanium less than the atomic percent titanium in the bulk layer.

7. The method of claim 6, wherein forming the barium-strontium-titanate film comprises decreasing a flow rate of the titanium-containing organometallic precursor during a first time period for forming the interfacial layer relative to the flow rate of the titanium-containing organometallic precursor during a time period for forming the bulk layer.

8. The method of claim 6, wherein forming the barium-strontium-titanate film comprises increasing the total flow rate of the barium-containing organometallic precursor and the strontium-containing organometallic precursor during a first time period for forming the interfacial layer relative to the total flow rate of the barium-containing organometallic precursor and the strontium-containing organometallic precursor during a time period for forming the bulk layer.

9. The method of claim 6, wherein forming the barium-strontium-titanate film comprises subsequently providing the barium-containing organometallic precursor, the strontium-containing organometallic precursor, and the titanium-containing organometallic precursor to the chemical vapor deposition chamber such that the bulk layer comprises from about 50.0 to about 53.5 atomic percent titanium.

10. The method of claim 6, wherein the interfacial layer is formed in less than about 50 seconds after initially providing the organometallic precursors to the chemical vapor deposition chamber.

11. The method of claim 1, wherein forming the interfacial layer and the bulk layer are accomplished under substantially continuous chemical vapor deposition.

12. A method for use in formation of a capacitor, the method comprising:

providing a first electrode having a surface;

forming a barium-strontium-titanate dielectric film on at least a portion of the surface of the first electrode, wherein the barium-strontium-titanate film comprises:

an interfacial barium-strontium-titanate layer on the at least a portion of the surface of the first electrode, and a bulk barium-strontium-titanate layer comprising from about 50 atomic percent to about 53.5 atomic percent titanium, wherein the interfacial layer comprises from about 1 atomic percent to about 3 atomic percent less titanium than the bulk dielectric film; and forming a second electrode on at least a portion of the barium-strontium-titanate dielectric film and further wherein the bulk barium-strontium-titanate layer has a thickness greater than the interfacial barium-strontium-titanate layer.

13. The method of claim 12, wherein the interfacial layer has a thickness of less than half of a total thickness of the dielectric film.

14. The method of claim 12, wherein the first electrode comprises a conductive material including at least one of platinum, titanium, tantalum, ruthenium, osmium, iron, rhodium, cobalt, nickel, iridium, palladium, cerium, tungsten, aluminun, copper, including conductive nitrides and oxides thereof.

15. The method of claim 14, wherein the first electrode comprises platinum.

16. The method of claim 12, wherein the interfacial layer comprises a greater atomic percent of barium relative to the atomic percent of strontium in the interfacial layer.

17. The method of claim 12, wherein forming the barium-strontium-titanate film comprises providing a barium-containing organometallic precursor, a strontium-containing organometallic precursor, and a titanium-containing organometallic precursor to a chemical vapor deposition chamber containing the first electrode, wherein a concentration of the barium-containing organometallic precursor, the strontium-containing organometallic precursor, and the titanium-containing organometallic precursor in the chemical vapor deposition chamber is such that the interfacial layer formed includes from about 1 atomic percent to about 3 atomic percent titanium less than the atomic percent titanium in the bulk layer.

18. The method of claim 17, wherein forming the barium-strontium-titanate film comprises controlling a flow rate of one or more of the barium-containing organometallic precursor, the strontium-containing organometallic precursor, and the titanium-containing organometallic precursor to the chemical vapor deposition chamber.

19. A method of forming a titanium-containing dielectric film comprising:

forming a titanium-containing interfacial dielectric layer on a substrate assembly surface; and forming a titanium-containing bulk dielectric layer, wherein the atomic percent titanium in the interfacial layer is less than the atomic percent of titanium in the bulk layer, wherein forming the titanium-containing interfacial layer comprises providing a first organometallic precursor and a titanium-containing organometallic precursor to a chemical vapor deposition chamber containing the substrate assembly, wherein a concentration of the first organometallic precursor and the titanium-containing organometallic precursor in the chemical vapor deposition chamber is such that a substantially equal to or higher dielectric constant is attained for the interfacial layer relative to the bulk layer and further wherein the bulk dielectric layer has a thickness greater than the interfacial dielectric layer.

20. The method of claim 19, wherein the dielectric film comprises a material selected from the group consisting of $BaSrTiO_3$; $BaTiO_3$; $SrTiO_3$; $PbTiO_3$; $Pb(Zr,Ti)O_3$; $(Pb,La)(Zr,Ti)O_3$; $(Pb,La)TiO_3$; and a combination thereof.

21. The method of claim 19, wherein the dielectric film comprises a $BaSrTiO_3$ film and the interfacial dielectric layer comprises from about 1 atomic percent to about 3 atomic percent less titanium than the bulk dielectric layer.

22. The method of claim 19, wherein forming the titanium-containing interfacial layer comprises decreasing a flow rate of the titanium-containing organometallic precursor during a first time period for forming the interfacial layer relative to the flow rate for the titanium-containing organometallic precursor during a time period for forming the bulk layer.

23. The method of claim 19, wherein forming the titanium-containing interfacial layer comprises increasing the flow rate of the first organometallic precursor during a first time period for forming the interfacial layer relative to the flow rate for the first precursor during a time period for forming the bulk layer.

24. The method of claim 19, wherein forming the titanium-containing bulk dielectric layer comprises forming a titanium-containing bulk dielectric layer having from about 50.0 to about 53.5 atomic percent titanium.

25. The method of claim 19, wherein the interfacial layer is formed in less than about 50 seconds after initially providing the organometallic precursors to the chemical vapor deposition chamber.

26. A method of providing a dielectric film, the method comprising forming a dielectric film using one or more organometallic precursors, wherein forming the dielectric film includes:

forming an interfacial dielectric layer on a substrate assembly surface using the one or more organometallic precursors; and forming a bulk dielectric layer on the interfacial dielectric layer, wherein the atomic percent of at least one metal component present in the interfacial layer is controlled such that a higher dielectric constant is attained for the interfacial dielectric layer relative to the bulk dielectric layer and further wherein the bulk dielectric layer has a thickness greater than the interfacial dielectric layer.

27. The method of claim 26, wherein the one or more organometallic precursors are selected from the group consisting of barium-containing organometallic precursor, strontium-containing organometallic precursor, lead-containing organometallic precursor, zirconium-containing organometallic precursor, bismuth-containing organometallic precursor, titanium-containing organometallic precursor, tantalum-containing organometallic precursor, niobium-containing organometallic precursor, lithium-containing organometallic precursor, and lanthanum-containing organometallic precursor, wherein the atomic percent of at least one of barium, strontium, lead, zirconium, bismuth, titanium, tantalum, niobium, lithium, and lanthanum present in the interfacial layer is controlled such that a substantially equal to or higher dielectric constant is attained for the interfacial layer relative to the bulk layer.

28. The method of claim 26, wherein the dielectric film comprises a material selected from the group consisting of $BaSrTiO_3$; $BaTiO_3$; $SrTiO_3$; $PbTiO_3$; $Pb(Zr,Ti)O_3$; $(Pb,La)(Zr,Ti)O_3$; $(Pb,La)TiO_3$; $Ta_2O_5$; $(Pb,La)TiO_3$; $KNO_3$; $LiNbO_3$; $Sr_xBi_{1-x}Ta_7O_9$; $SrBiNbTaO$; $SrBiNb$; and a combination thereof.

29. The method of claim 26, wherein the atomic percent of the at least one metal component present in the interfacial layer is controlled by controlling a flow rate of at least one of the one or more organometallic precursors to a chemical vapor deposition chamber.

30. The method of claim 26, wherein the interfacial layer is formed in an early nucleation stage after initially providing the one or more organometallic precursors to a chemical vapor deposition chamber.

31. The method of claim 30, wherein the interfacial layer is formed in less than about 50 seconds after initially providing the one or more organometallic precursors to the chemical vapor deposition chamber.

32. A method for use in fabrication of integrated circuits, the method comprising:

providing a substrate assembly having a surface; and forming a barium-strontium-titanate film on at least a portion of the surface, wherein the barium-strontium-titanate film comprises an interfacial layer having an atomic percent of titanium less than or equal to the atomic percent of titanium in a bulk layer of the film, and further wherein the interfacial layer comprises a greater atomic percent of barium relative to the atomic percent of strontium.

33. The method of claim 32, wherein the bulk layer of the barium-strontium-titanate film comprises from about 50.0 atomic percent to about 53.5 atomic percent titanium.

34. The method of claim 33, wherein the interfacial layer comprises from about 1 atomic percent to about 3 atomic percent titanium less than the bulk layer.

35. The method of claim 32, wherein the barium-strontium-titanate film is less than about 600 Å thick.

* * * * *